United States Patent

Messman

[11] Patent Number: 5,553,096
[45] Date of Patent: Sep. 3, 1996

[54] GAIN CONTROL USING PWM

[75] Inventor: Bruce E. Messman, Lake In The Hills, Ill.

[73] Assignee: Zenith Electronics Corporation, Glenview, Ill.

[21] Appl. No.: 298,256

[22] Filed: Aug. 30, 1994

[51] Int. Cl.⁶ .................................................. H04B 3/46
[52] U.S. Cl. .......................... 375/238; 375/345; 329/312
[58] Field of Search ................................. 375/238, 317, 375/345; 327/26, 172; 332/109; 340/825.63; 329/311, 312

[56] References Cited

U.S. PATENT DOCUMENTS

| | | |
|---|---|---|
| 3,535,657 | 9/1967 | Carlson et al. ........................ 375/238 |
| 4,280,219 | 7/1981 | Lowenschuss et al. ................ 375/317 |
| 4,524,335 | 6/1985 | Yokoyama ............................. 375/238 |
| 4,549,151 | 10/1985 | Kaneko ................................. 375/238 |

Primary Examiner—Stephen Chin
Assistant Examiner—Huong Luu

[57] ABSTRACT

A gain control circuit utilizes a PWM having its transfer function characteristics determined by a ramp and a DC supply voltage. An input signal modulates the PWM and an integrating circuit at the output of the PWM recovers a replica of the input signal. Changing one or more of the transfer function characteristics of the PWM results in a change in the amplitude of the recovered replica of the input signal. Changing the ramp frequency may also be used to effect gain control. An arrangement in a television deflection circuit with raster correction is shown.

8 Claims, 2 Drawing Sheets 5,553,096

GAIN CONTROL USING PWM

BACKGROUND OF THE INVENTION AND PRIOR ART

This invention relates in general to gain control circuits and specifically to a novel gain control circuit that uses a pulse width modulator (PWM) as the gain control element. There is a need in many electronic applications to control the gain of an amplifier by means of a DC control voltage. Some of these applications include audio compression-expansion arrangements, AGC circuits, noise reduction circuits, digital controls for audio signals such as volume and tone, television raster correction circuits, analog multipliers and active noise cancellation circuits. It is well known to use analog multipliers to perform gain control functions. The invention provides a novel gain control that changes the transfer function characteristics of a PWM for effecting a gain control action.

In the particular application described, namely the control of raster correction signals in a television environment, the feature of using the frequency of the ramp voltage of the PWM for gain control is especially desirable. Such an arrangement will find ready application in television receivers and monitors that are designed to operate at several different scanning frequencies and in different modes. In such a multi frequency television monitor application, the voltage supply to the television scanning circuitry must be increased as the scanning frequency is increased while the voltage supply is modulated by a correction waveform to produce well known raster correction for distortions such as pin cushion, keystone, etc. on the cathode ray tube. For proper tracking of the raster correction, the amplitude of the raster correction signal must be held as a constant percentage of the supply voltage. Consequently, as the scanning frequency increases, the required amplitude of the correction signal increases also. The specific television deflection system application of the present invention is especially well suited for this purpose.

The pulse width modulator is formed by a voltage ramp generator, and a comparator or very high gain amplifier. Its output is coupled to an integrator. A low pass filter is also useful to filter the signal at the output of the integrator. As illustrated in FIG. 1, the transfer function characteristics of a pulse width modulator, formed by a ramp generator and a comparator, are altered to change the gain of the circuit. Consequently, the amplitude of the output waveform can thus be modulated.

Gain can be determined by the following formula:

$$\text{Gain} = V_{cc} \div V_{rmp}.$$

Thus the output voltage may be determined by $V_{out}$ is equal to $V_{cc} \div V_{rmp} \times V_{in}$ where, $V_{rmp}$ is the peak to peak ramp voltage at the pulse width modulator output;

$V_{cc}$ is the supply voltage to the output for the PWM;

$V_{in}$ is equal to the input signal at the comparator input; and $V_{out}$ is equal to the output voltage after integration.

As shown by the above formula, changing the gain of the circuit may be accomplished by changing either $V_{cc}$ or $V_{rmp}$. Therefore, the output signal amplitude can be made to be a gain altered replica of the input signal by controlling one or more of the transfer function characteristics of the PWM.

OBJECTS OF THE INVENTION

A principal object of the invention is to provide a novel gain control circuit.

Another object of the invention is to provide a gain control circuit utilizing a PWM.

A further object of the invention is to provide an improved deflection system for a television monitor or the like.

BRIEF DESCRIPTION OF THE DRAWINGS

These and other objects and advantages of the invention will be apparent upon reading the following description in conjunction with the drawings, in which:

FIG. 3 is a block diagram of the gain control circuit of the invention utilized in a deflection system for a television monitor or the like.

DESCRIPTION OF THE PREFERRED EMBODIMENT

Figure 1:
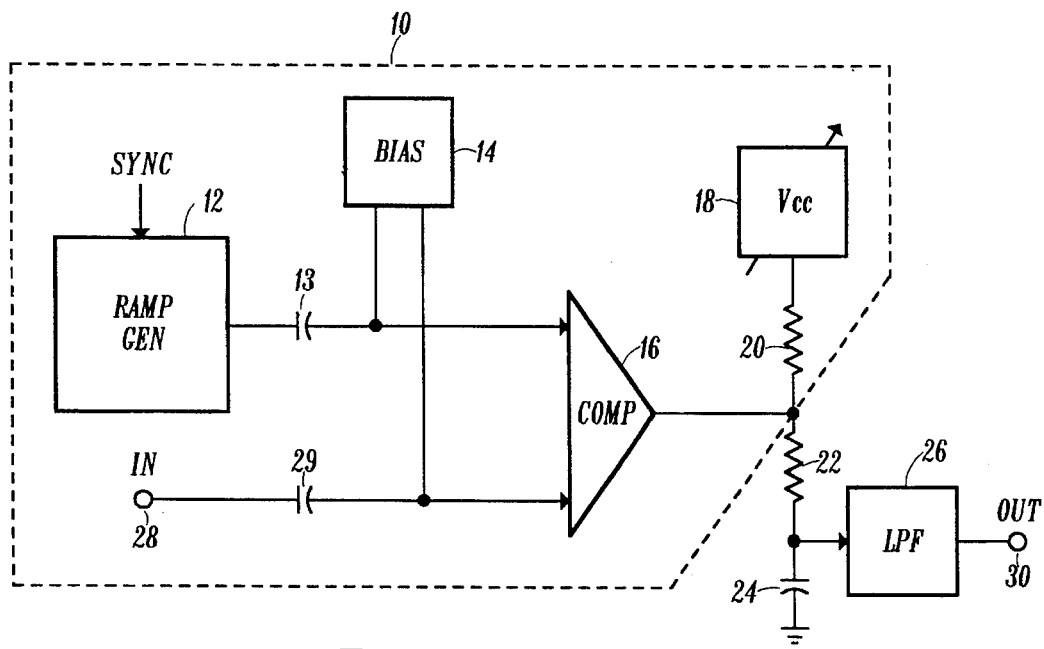
FIG. 1 is a simplified block diagram of the gain control circuit of the invention.

In FIG. 1, the dashed line block 10 encloses the elements of a pulse width modulator. Included therein is a ramp generator 12, a bias source 14, a comparator 16, a source of B+ voltage $V_{cc}$ 18, an integrating network comprising resistors 20, 22 and capacitor 24, and a low pass filter 26. A source of sync input is shown for ramp generator 12 for controlling the frequency of the ramp voltage developed. A coupling capacitor 13 couples the output of ramp generator 12 to one input of comparator 16, the other input of which is supplied with the input signal applied to an input terminal 28, via a capacitor 29. The arrow drawn through the block $V_{cc}$ 18 indicates that the DC source is variable. The amplified output signal is taken from terminal 30. The output signal will be a gain altered replica of the input signal applied to input terminal 28.

The ramp generator 12 produces a linear voltage ramp that is synchronized with the incoming synchronizing signal. This may be accomplished for example by using a constant current source to charge a timing capacitor (neither of which are shown). The sync signal transition will cause the capacitor to rapidly discharge. The capacitor is then allowed to recharge and the cycle repeats at the period of the incoming synchronizing pulses. The method is commonly referred to as injection lock and provides a peak to peak ramp amplitude voltage that is inversely proportional to the incoming sync frequency. The bias source 14 is high impedance and provides a DC bias to both inputs of the voltage comparator. With no input signal applied to terminal 28, the PWM 10 produces a 50% duty cycle square wave that is locked to the incoming sync pulse. The integrator formed by resistor 22 and capacitor 24 will develop a voltage across the capacitor 24 equal to one-half of $V_{cc}$. This is the quiescent state of the circuit.

With an input signal that is mulch lower in frequency than the applied synchronization frequency, the duty cycle of the PWM is modulated above and below 50%. The modulation is integrated by the integrator which produces an amplitude modified replica of the input signal. This output can be filtered by low pass filter 26 to further reduce the ripple from the PWM circuit.

Those skilled in the art will readily recognize that when the synchronizing pulse frequency is increased, i.e. doubled for example, the peak amplitude of the voltage ramp is reduced proportionately, i.e. halved. This changes the transfer function of the PWM such that the same input signal now causes a larger modulation of the PWM duty cycle. The gain function is fixed at 6.0 db of gain change per octave of the synchronization pulse frequency. This fixed function is quite useful in television/monitor raster correction circuits since it eliminates the need for adjustment of gain as a function of scanning frequency.

As indicated by the variability shown for $V_{cc}$ 18, the gain of the circuit may also be changed by suitable changes to $V_{cc}$ 18. The effect of changing $V_{cc}$ 18 is to alter the operating rate of the integrating circuit, thus producing a correspondingly larger or smaller output signal.

Figure 2:
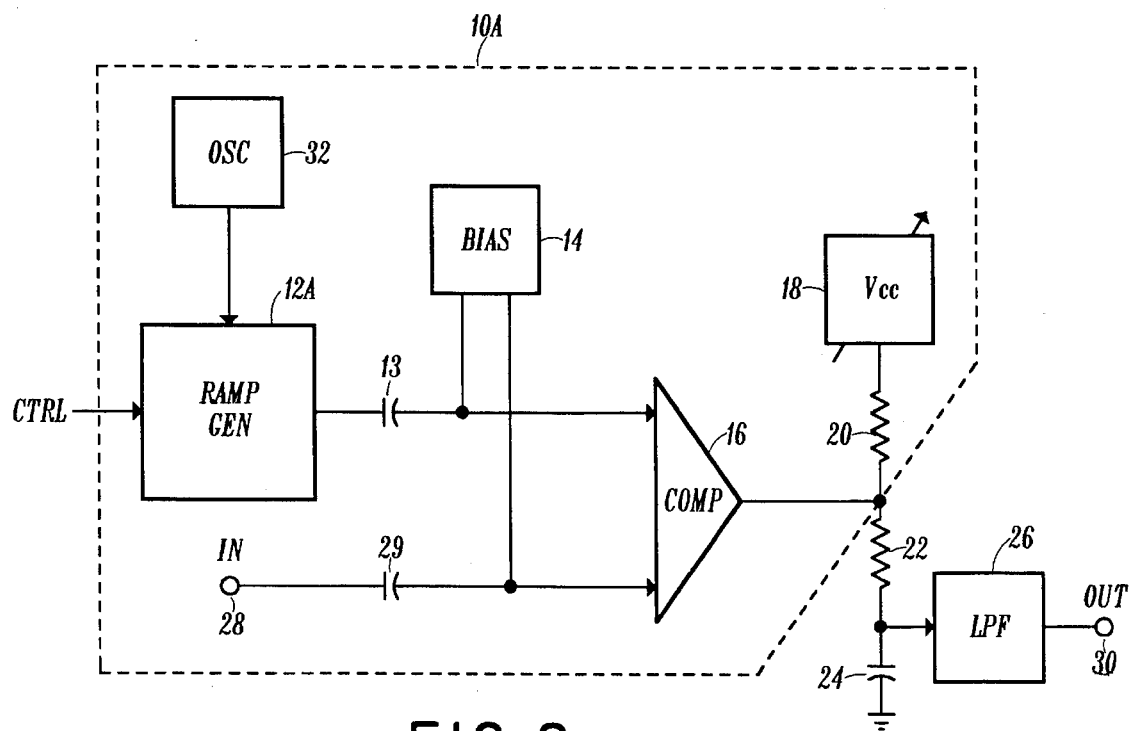
FIG. 2 is a modified version of the gain control circuit of the invention.

In FIG. 2, PWM 10A is similarly indicated by the components within the dashed line block. The circuits are essentially the same as those illustrated in FIG. 1 with the exception that an oscillator 32 is used in place of the sync signal to supply a ramp generator 12A. Further, a DC control voltage input CTRL to ramp generator 12A is shown, the control input being such as to vary the peak to peak ramp voltage. Assuming that the frequency of oscillator 32 is fixed, the gain of the circuit in FIG. 2 may be changed by changing either the control voltage CTRL or $V_{cc}$ 18. CTRL modulates the charging current to the ramp generator 12A and therefore the peak voltage of the voltage ramp, resulting in a change of transfer function in the circuit which alters the circuit gain. This particular configuration permits "ganging" whereby all output signal amplitudes can be controlled by a single control signal with good tracking characteristics. It is particularly useful where a large change in gain is desired from a small change in control voltage. The response time of the configuration can be made extremely fast. The method produces a constant output ripple voltage, so signal to noise ratio is best at maximum gain.

As discussed, the gain may be varied by changing the supply voltage $V_{cc}$ 18. For example, doubling the DC supply voltage $V_{cc}$ 18 results in the peak to peak voltage at the output of the comparator being doubled. Since the integrated output signal peak voltage is a product of the PWM duty cycle times $V_{cc}$ 18, the integrated output signal amplitude is also doubled. The method has the advantage that the circuit gain is directly proportional to the control voltage so that doubling the supply voltage doubles the gain (6 dB output gain change per 6 dB change in supply voltage). This eliminates the need for adjustment of gain change when a fixed function is all that is required, as is the case with a CRT raster correction circuit. Also the output signal to noise ratio is constant because as the output signal is reduced (by reducing the supply voltage), the output ripple from the PWM is also reduced. Here again, the output of the integrator can be further filtered by a low pass filter 26 to increase the signal to noise ratio. As will be seen in FIG. 3, a special technique for removing high frequency PWM components may also be used.

Figure 3:
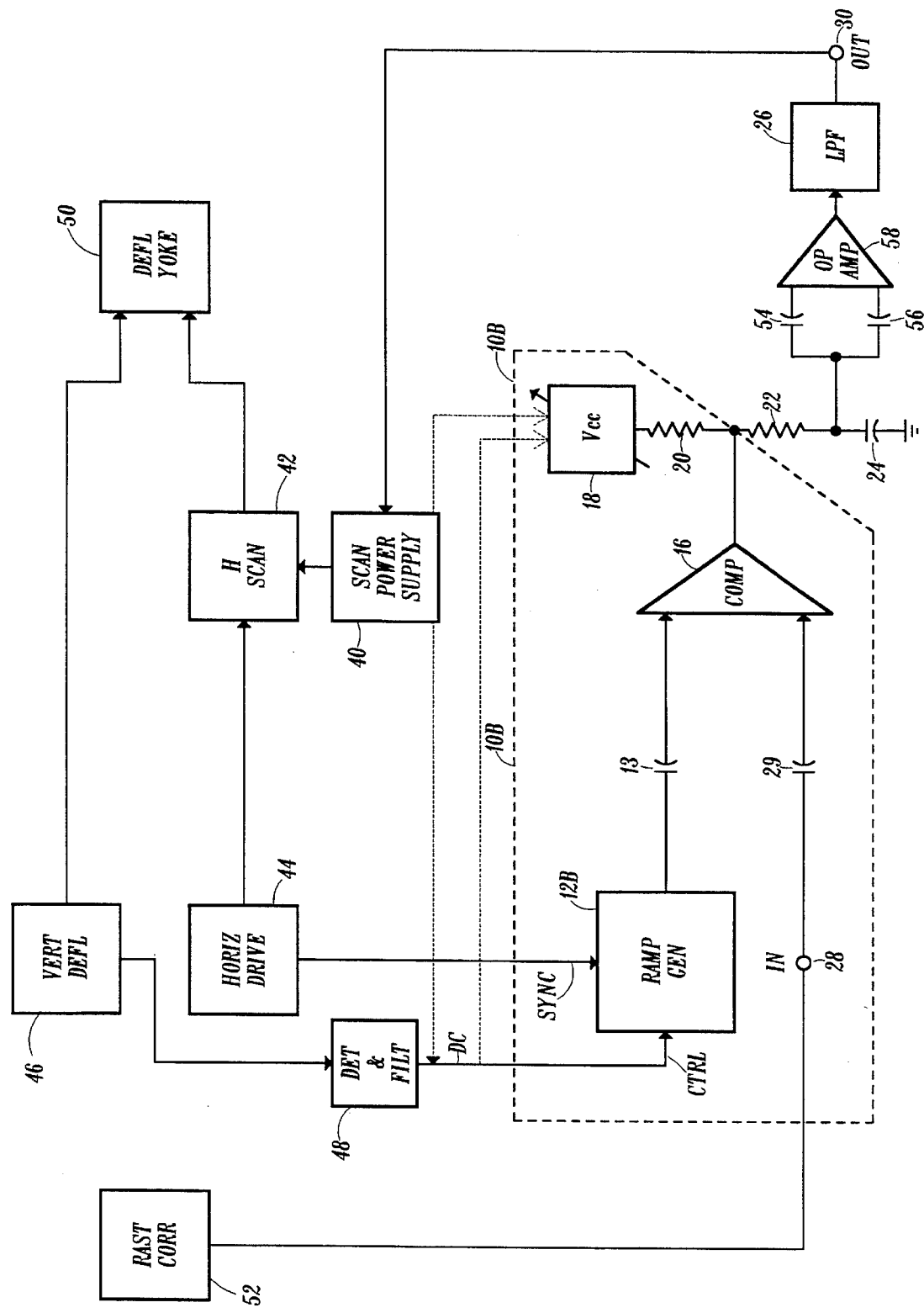

In FIG. 3, the gain control circuit of the invention is shown in connection with a television receiver/monitor deflection circuit. A scanning power supply 40 controls a horizontal scanning circuit 42 that feeds a deflection yoke 50. A horizontal drive circuit 44 controls the horizontal scanning circuit 42. A vertical deflection circuit 46 also supplies deflection yoke 50 and is coupled to a detector and filter 48 for developing a small DC voltage that is indicative of the vertical deflection signal. This small DC voltage is supplied as the control input to ramp generator 12B. The output of horizontal drive 44 is also supplied as a sync input to ramp generator 12B. A raster correction circuit 52 develops a raster correction voltage that is supplied to input terminal 28 of PWM 10B. The output of the integrator, comprising resistor 22 and capacitor 24, is coupled through parallelly connected capacitors 54 and 56 to the inputs of an operational amplifier 58 that in turn is coupled via LPF 26 to output terminal 30. As mentioned briefly in connection with FIG. 2, the capacitors 54 and 56 are selected such that one will only pass the ripple or noise signal present in the output of capacitor 24 due to the PWM action, whereas the other capacitor supplies the entire signal. Since the noise components are identical at both inputs of operational amplifier 58, but of opposite polarity, they tend to cancel in its output, thus minimizing the high frequency PWM noise.

Output terminal 30 is coupled to scanning power supply 40 and supplies a gain corrected raster correction signal to power supply 40. As indicated by the dotted lines, alternative connections may be employed. Thus the DC supplied by detector and filter 48 as a control at the ramp generator 12B may alternatively be supplied as a correction signal for changing $V_{cc}$ 18. Further, scan power supply 40 may supply the DC control signal for ramp generator 12B or the control voltage for changing $V_{cc}$ 18. Those skilled in the art will readily understand this use of alternate control paths to avoid the complication of additional drawing figures.

The FIG. 3 embodiment is a multi frequency scanning circuit. As discussed above, the amplitude of the raster correction signal from raster correction circuit 52 must be adjusted proportionately to the incoming scanning frequency. The horizontal scanning rate pulse from the horizontal drive circuit 44 is injected as a sync input to ramp generator 12B which automatically causes the raster correction signal amplitude at the output terminal 30 to be proportional to the scanning frequency. The DC voltage developed by detector and filter 48 is proportional to the vertical deflection signal amplitude and a portion of this DC voltage is supplied as CTRL or optionally, as indicated by the dotted line to $V_{cc}$ 18, to allow the amplitude of the raster correction signal to track changes in the amplitude of the vertical deflection. Should it be desired, a portion of the scanning power supply output can also be used as CTRL or to alter $V_{cc}$ 18 to permit the correction signal amplitude to automatically compensate for changes in the amount of horizontal deflection.

It is recognized that numerous changes in the described embodiment of the invention will be apparent to those skilled in the art without departing from its true spirit and scope. The invention is to be limited only as defined in the claims.

What is claimed is:

1. A method of processing an input signal comprising the steps of:

modulating a pulse width modulator (PWM) with said input signal;

supplying a direct current voltage to the output of said PWM;

integrating the output of said PWM to recover a processed replica of said input signal by charging a capacitor from said direct current voltage; and changing said direct current voltage to change the amplitude of said processed replica of said input signal.

2. An apparatus comprising:

a pulse width modulator (PWM);

means for modulating said PWM with an input signal;

means for supplying a direct current voltage to the output of said PWM;

integrating means for recovering a processed replica of said input signal from said output of said PWM; and means for changing said direct current voltage for controlling the amplitude of said processed replica of said input signal by altering the rate of operation of said integrating means.

3. An apparatus comprising:

a pulse width modulator (PWM) including a ramp and a direct current voltage supply;

means for modulating said PWM with an input signal;

integrating means, comprising a capacitor charged from said direct current voltage supply, for recovering a processed replica of said input signal from the output of said PWM; and means for controlling one or both of said ramp and said direct current voltage supply for controlling the amplitude of said processed replica of said input signal.

4. A television deflection circuit comprising:

a pulse width modulator including a ramp and a direct current voltage supply;

means for modulating said PWM with an input signal;

integrating means for recovering a processed replica of said input signal from the output of said PWM;

a scanning power supply coupled to said output of said PWM;

raster correction means for developing a raster correction signal;

means for coupling said raster correction signal as said input signal to said PWM; and means for controlling one or both of said ramp and said direct current voltage supply for controlling the amplitude of said processed replica of said input signal.

5. The apparatus of claim 4, further including:

a vertical deflection circuit and a horizontal deflection circuit; and means applying a direct current voltage developed from said vertical deflection circuit for controlling one of the amplitude of said ramp and the magnitude of said direct current voltage supply.

6. The apparatus of claim 4, further including a vertical deflection circuit and a horizontal deflection circuit and means for coupling said horizontal deflection circuit for controlling the frequency of said ramp.

7. The apparatus of claim 4, further including a PWM noise elimination filter coupled between said output of said PWM and said scanning power supply.

8. The apparatus of claim 4 wherein said scanning power supply controls one of the amplitude of said ramp and said direct current voltage supply.

* * * * *